(12) United States Patent
Lee et al.

(10) Patent No.: US 12,107,121 B2
(45) Date of Patent: Oct. 1, 2024

(54) METHOD FOR FORMING AIR GAP BETWEEN GATE DIELECTRIC LAYER AND SPACER

(71) Applicant: UNITED MICROELECTRONICS CORP., Hsin-Chu (TW)

(72) Inventors: Zhi-Cheng Lee, Tainan (TW); Chuang-Han Hsieh, Tainan (TW); Kai-Lin Lee, Kinmen County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 211 days.

(21) Appl. No.: 17/515,563

(22) Filed: Nov. 1, 2021

(65) Prior Publication Data

US 2023/0102936 A1 Mar. 30, 2023

(30) Foreign Application Priority Data

Sep. 30, 2021 (CN) .......................... 202111160515.4

(51) Int. Cl.
| | |
|---|---|
| *H01L 29/06* | (2006.01) |
| *H01L 21/8234* | (2006.01) |
| *H01L 29/08* | (2006.01) |
| *H01L 29/49* | (2006.01) |
| *H01L 29/51* | (2006.01) |
| *H01L 29/66* | (2006.01) |
| *H01L 29/78* | (2006.01) |

(52) U.S. Cl.
CPC .. *H01L 29/0649* (2013.01); *H01L 21/823418* (2013.01); *H01L 21/823481* (2013.01); *H01L 29/0847* (2013.01); *H01L 29/515* (2013.01); *H01L 29/7851* (2013.01)

(58) Field of Classification Search
CPC ............ H01L 29/66545; H01L 29/515; H01L 29/0649; H01L 21/823481; H01L 29/4991; H01L 29/66553; H01L 29/517; H01L 29/495; H01L 29/6653; H01L 29/0847; H01L 29/4232; H01L 29/6656; H01L 21/7682; H01L 29/512
See application file for complete search history.

(56) References Cited

U.S. PATENT DOCUMENTS

| | | | | |
|---|---|---|---|---|
| 5,990,532 | A * | 11/1999 | Gardner | H01L 29/6659 257/411 |
| 6,468,877 | B1 * | 10/2002 | Pradeep | H01L 21/823468 257/E21.573 |
| 6,635,967 | B2 | 10/2003 | Chang et al. | |
| 6,891,235 | B1 * | 5/2005 | Furukawa | H01L 21/28114 257/E29.054 |
| 8,421,166 | B2 | 4/2013 | Chi et al. | |
| 9,559,184 | B2 * | 1/2017 | Ching | H01L 29/785 |
| 2007/0018238 | A1 * | 1/2007 | Ono | H01L 29/513 257/327 |

* cited by examiner

*Primary Examiner* — Sonya McCall-Shepard
(74) *Attorney, Agent, or Firm* — Winston Hsu

(57) ABSTRACT

A method for fabricating a semiconductor device includes the steps of first forming a gate dielectric layer on a substrate, forming a gate material layer on the gate dielectric layer, patterning the gate material layer and the gate dielectric layer to form a gate structure, removing a portion of the gate dielectric layer, forming a spacer adjacent to the gate structure and at the same time forming an air gap between the gate dielectric layer and the spacer, and then forming a source/drain region adjacent to two sides of the spacer.

5 Claims, 3 Drawing Sheets

METHOD FOR FORMING AIR GAP BETWEEN GATE DIELECTRIC LAYER AND SPACER

BACKGROUND OF THE INVENTION

1. Field of the Invention

The invention relates to a method for fabricating semiconductor device, and more particularly to a method of forming air gap between gate dielectric layer and spacer.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, problem such as gate-induced-drain-leakage (GIDL) often arise when doped region such as lightly doped drain or source/drain region is too close to the gate structure. Hence, how to resolve this issue has become an important task in this field.

SUMMARY OF THE INVENTION

According to an embodiment of the present invention, a method for fabricating a semiconductor device includes the steps of first forming a gate dielectric layer on a substrate, forming a gate material layer on the gate dielectric layer, patterning the gate material layer and the gate dielectric layer to form a gate structure, removing a portion of the gate dielectric layer, forming a spacer adjacent to the gate structure and at the same time forming an air gap between the gate dielectric layer and the spacer, and then forming a source/drain region adjacent to two sides of the spacer.

According to another aspect of the present invention, a semiconductor device includes a gate structure on a substrate and a spacer adjacent to the gate structure. Preferably, the gate structure includes a gate dielectric layer on the substrate and a gate material layer on the gate dielectric layer, in which an air gap is between the gate dielectric layer and the spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
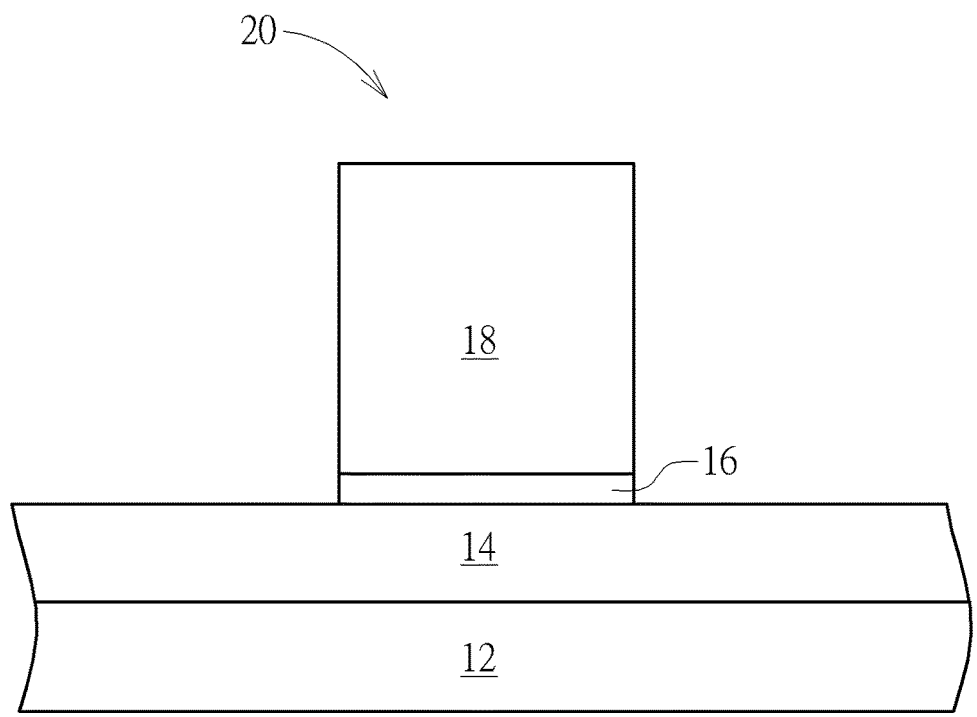
FIGS. 1-5 illustrate a method for fabricating a semiconductor device according to an embodiment of the present invention.

Referring to FIGS. 1-5, FIGS. 1-5 illustrate a method for fabricating a semiconductor device according to an embodiment of the present invention. As shown in FIG. 1, a substrate 12, such as a silicon substrate or silicon-on-insulator (SOI) substrate is first provided, and at least a transistor region such as a NMOS region or a PMOS region are defined on the substrate 12. Next, at least a fin-shaped structure 14 is formed on the substrate 12, in which the bottom of the fin-shaped structure 14 is surrounded by an insulating layer or shallow trench isolation (STI) made of material including but not limited to for example silicon oxide. It should be noted that even though this embodiment pertains to the fabrication of a non-planar FET device such as FinFET device, it would also be desirable to apply the following processes to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structure 20 or dummy gate is formed on the substrate 12. In this embodiment, the formation of the gate structure 20 could be accomplished by a gate first process, a high-k first approach from gate last process, or a high-k last approach from gate last process. Since this embodiment pertains to a high-k last approach, a gate dielectric layer 16 or interfacial layer, a gate material layer 18 made of polysilicon, and a selective hard mask could be formed sequentially on the substrate 12, and a pattern transfer process is then conducted by using a patterned resist (not shown) as mask to remove part of the gate material layer 18 and part of the gate dielectric layer 16 through single or multiple etching processes. After stripping the patterned resist, a gate structure 20 composed of a patterned gate dielectric layer 16 and a patterned gate material layer 18 is formed on the substrate 12.

Figure 2:
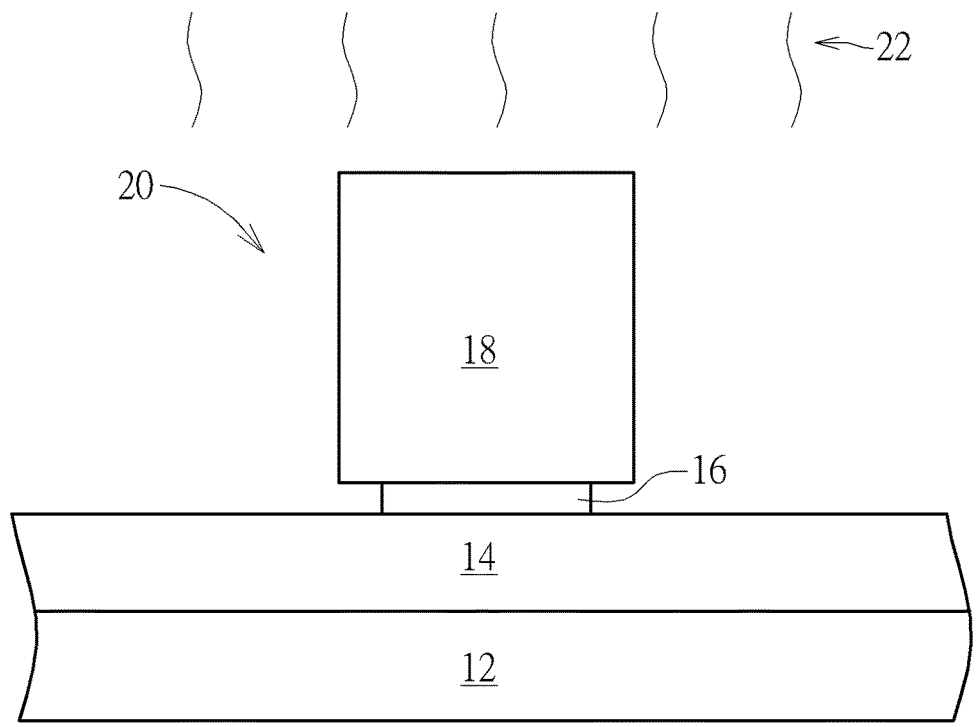

Next, as shown in FIG. 2, an etching process 22 is conducted without forming any patterned mask to remove part of the gate dielectric layer 16. In this embodiment, the recipe of the etching process 22 could include diluted hydrofluoric acid (dHF), the concentration of the dHF is preferably between 10:1 to 100:1, and the duration of the etching process 22 is between 1 minute to 10 minutes. For instance, if the concentration of dHF were controlled at 10:1 then the duration of the etching process is preferably conducted at around 1 minute, whereas if the concentration of dHF were controlled at around 100:1 then the duration of the etching process is conducted around 10 minutes. By using the above recipe to conduct the etching process 22, it would be desirable to only remove part of the gate dielectric layer 16 without damaging any of the gate material layer 18 made of polysilicon and two ends of the gate dielectric layer 16 that was originally aligned with two sidewalls of the gate material layer 18 would be slightly shrunk inward so that overall width of the gate dielectric layer 16 would be slightly less than overall width of the gate material layer 18.

Figure 3:
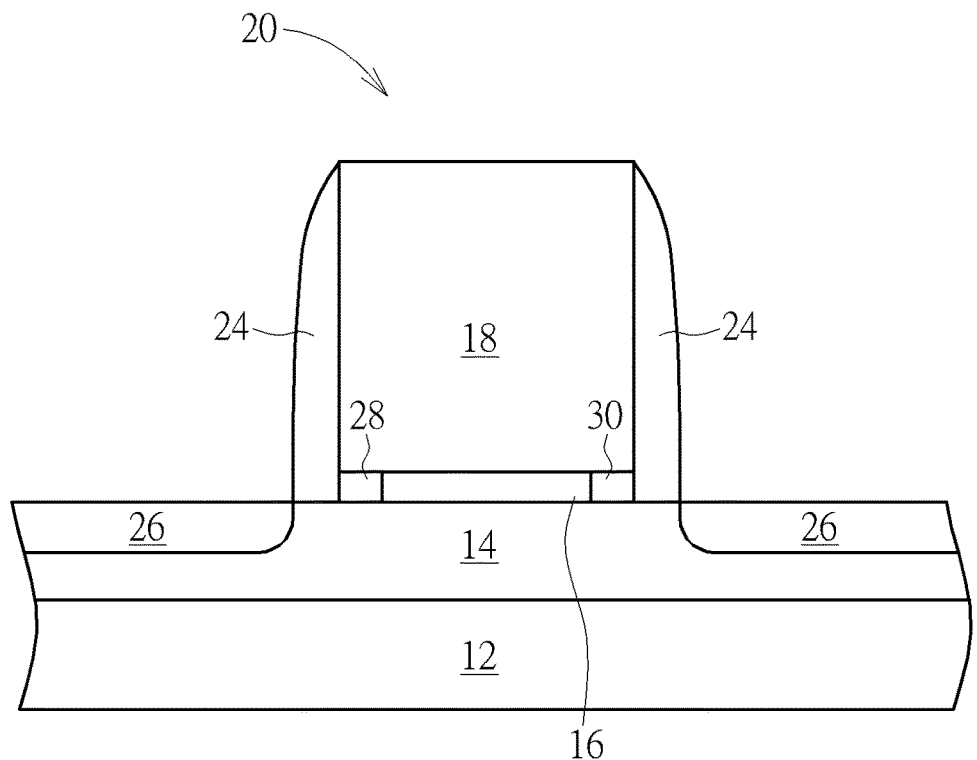

Next, as shown in FIG. 3, at least a spacer 24 is formed on the sidewalls of the gate structure 20, a source/drain region 26 and/or epitaxial layer (not shown) is formed in the substrate 12 adjacent to two sides of the spacer 24, and a selective silicide (not shown) is formed on the surface of the source/drain region 26 and/or epitaxial layer. It should be noted that during the formation of the spacer 24 at this stage, air gaps are preferably formed at the same time between the shrunk gate dielectric layer 16 and the spacer 24, in which the air gaps further include an air gap 28 disposed on one side such as left side of the gate structure 20 between the gate dielectric layer 16 and the spacer 24 and another air gap 30 disposed on another side such as right side of the gate structure 20 between the gate dielectric layer 16 and the spacer 24.

In this embodiment, the spacer 24 could be a single spacer or a composite spacer, such as a spacer including but not limited to for example an offset spacer (not shown) and a main spacer (not shown), in which the main spacer and the offset spacer could be made of same material or different materials while both main spacer and offset spacer could include dielectric materials including but not limited to for example $SiO_2$, SiN, SiON, SiCN, or combination thereof. The source/drain region 26 and the epitaxial layer could include different dopants and/or different materials depending on the type of transistor being fabricated. For instance, the source/drain region 26 could include n-type dopants or p-type dopants and the epitaxial layer could include silicon germanium (SiGe), silicon carbide (SiC), or silicon phosphide (SiP) depending on the type of device being fabricated.

Figure 4:
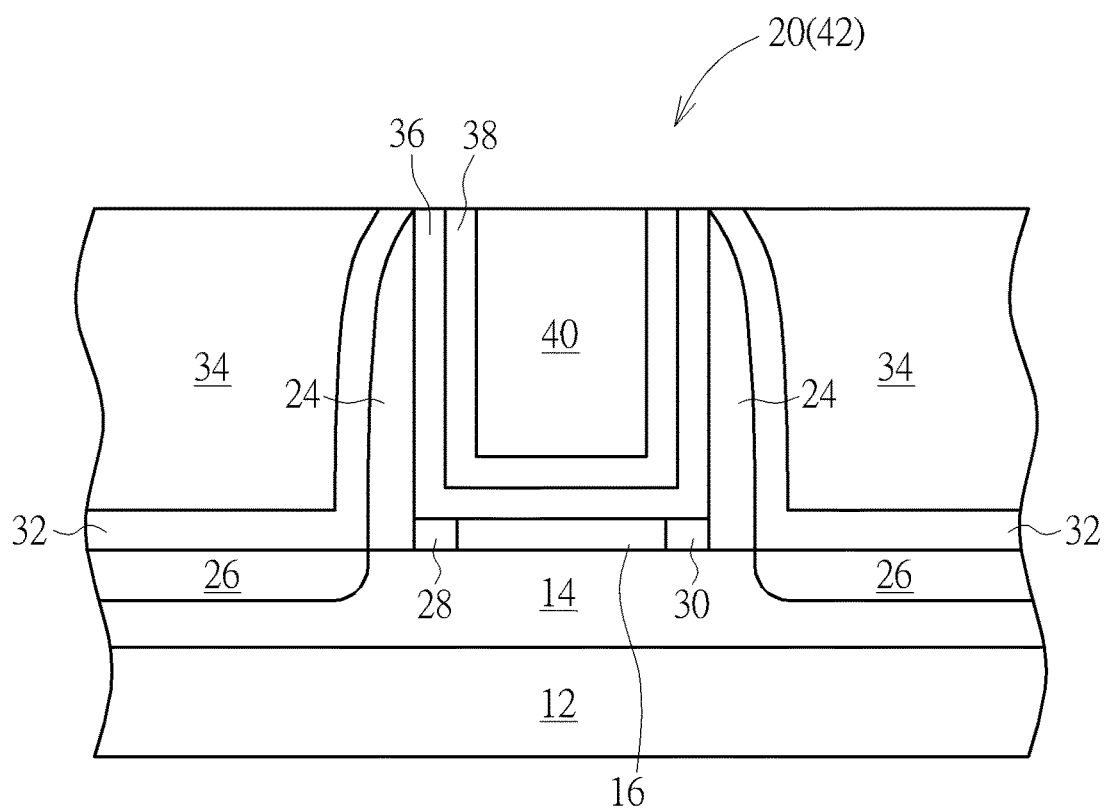

Next, as shown in FIG. 4, a contact etch stop layer (CESL) 32 is formed on the surface of the fin-shaped structures 14 to cover the spacer 24 and the gate structure 20, and an interlayer dielectric (ILD) layer 34 is formed on the CESL 32. Next, a planarizing process such as chemical mechanical polishing (CMP) process is conducted to remove part of the ILD layer 34 and part of the CESL 32 for exposing the gate material layer 18 made of polysilicon, in which the top surface of the gate material layer 18 is even with the top surface of the ILD layer 34.

Next, a replacement metal gate (RMG) process is conducted to transform the gate structure 20 into a metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 18 for forming a recess (not shown) in the ILD layer 34. Next, a high-k dielectric layer 36, a work function metal layer 38, and a low resistance metal layer 40 are formed in the recess, and a planarizing process such as CMP is conducted to remove part of low resistance metal layer 40, part of work function metal layer 38, and part of high-k dielectric layer 36 to form a metal gate 42.

Figure 5:
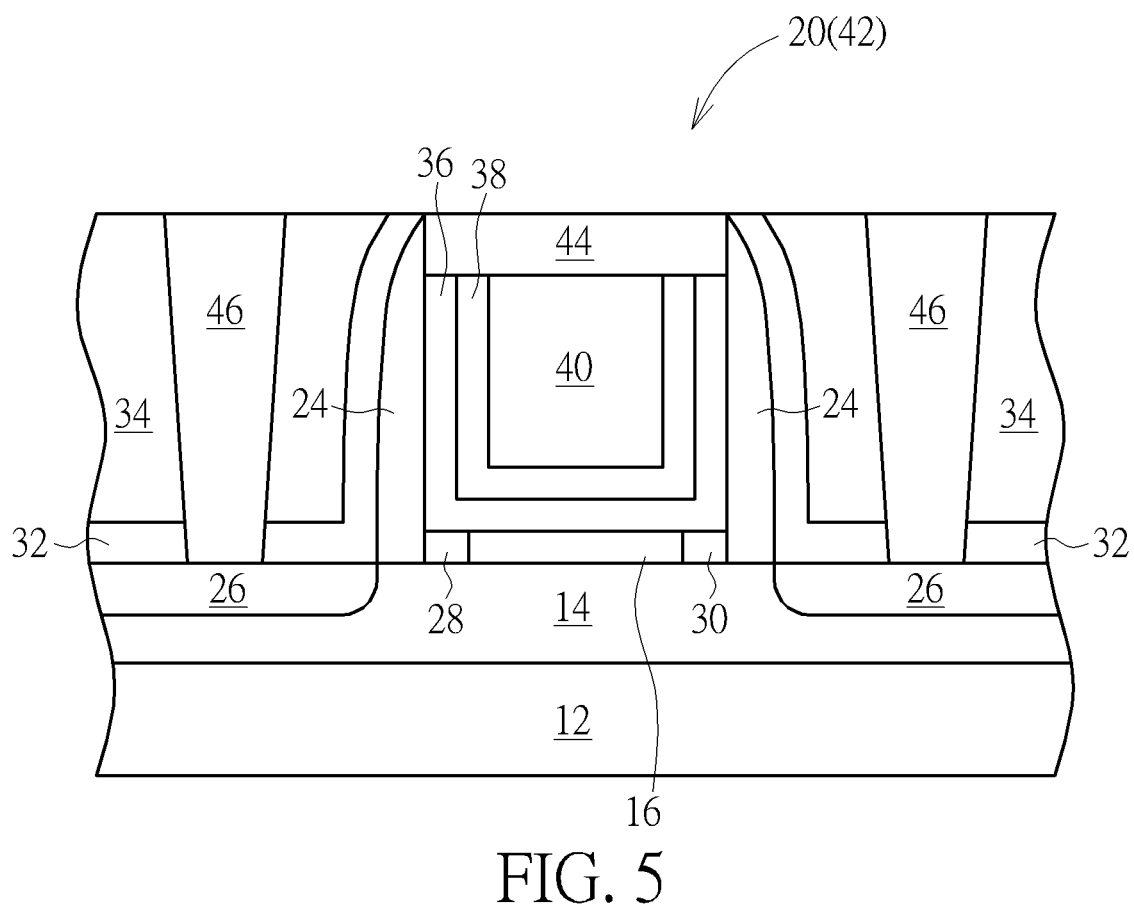

Next, as shown in FIG. 5, part of the low resistance metal layer 40, part of the work function metal layer 38, and part of the high-k dielectric layer 36 are removed to form another recess (not shown), and a hard mask 44 made of dielectric material including but not limited to for example silicon nitride is deposited into the recess so that the top surfaces of the hard mask 44 and ILD layer 34 are coplanar. In this embodiment, the gate structure or metal gate 42 fabricated through high-k last process of a gate last process preferably includes an interfacial layer or gate dielectric layer 16, a U-shaped high-k dielectric layer 36, a U-shaped work function metal layer 38, and a low resistance metal layer 40.

In this embodiment, the high-k dielectric layer 36 is preferably selected from dielectric materials having dielectric constant (k value) larger than 4. For instance, the high-k dielectric layer 36 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 38 is formed for tuning the work function of the metal gate in accordance with the conductivity of the device. For an NMOS transistor, the work function metal layer 38 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 38 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 38 and the low resistance metal layer 40, in which the material of the barrier layer may include titanium (Ti), titanium nitride (TiN), tantalum (Ta) or tantalum nitride (TaN). Furthermore, the material of the low-resistance metal layer 40 may include copper (Cu), aluminum (Al), titanium aluminum (TiAl), cobalt tungsten phosphide (CoWP) or any combination thereof.

Next, a photo-etching process is conducted by using a patterned mask (not shown) as mask to remove part of the ILD layer 34 and part of the CESL 32 adjacent to the metal gate 42 for forming contact holes (not shown) exposing the source/drain region 26 underneath. Next, metals or conductive materials including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 46 electrically connecting the source/drain region 26. This completes the fabrication of a semiconductor device according to an embodiment of the present invention.

Referring again to FIG. 5, FIG. 5 further illustrates a structural view of a semiconductor device according to an embodiment of the present invention. As shown in FIG. 5, the semiconductor device includes a metal gate 42 made of a gate structure 20 on the substrate 12, a spacer 24 adjacent to the gate structure 20, and a source/drain region 26 in the substrate 12 adjacent to two sides of the spacer 24, in which the gate structure 20 further includes a gate dielectric layer 16 and a gate electrode made of a high-k dielectric layer 36, a work function metal layer 38, and a low resistance metal layer 40. In this embodiment, at least an air gap is disposed between the gate dielectric layer 16 and the spacer 24, in which the air gap further include an air gap 28 disposed on one side such as left side of the gate structure 20 between the gate dielectric layer 16 and the spacer 24 and another air gap 30 disposed on another side such as right side of the gate structure 20 between the gate dielectric layer 16 and the spacer 24.

Typically, problem such as gate-induced-drain-leakage (GIDL) often arise when doped region such as lightly doped drain or source/drain region is too close to the gate structure during current fabrication of high-k metal transistor. To resolve this issue, the present invention first forms a gate structure, conducts an etching process to remove part of the gate dielectric layer so that the overall width of the gate dielectric layer is shrunk inward slightly, and then forms a spacer adjacent to the gate structure and at the same time forms air gaps between the gate structure and the spacer. According to a preferred embodiment of the present invention, the formation of the air gaps adjacent to two sides of the gate dielectric layer and directly under the gate electrode made of polysilicon or a combination of high-k dielectric layer 36, work function metal layer 38, and low resistance metal layer 40 could effectively relieve or reduce the occurrence of GIDL thereby improving performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a gate structure on a substrate, wherein the gate structure comprises
a gate dielectric layer on the substrate;
a gate electrode on the gate dielectric layer, wherein the gate electrode comprise:
a high-k dielectric layer on the gate dielectric layer; and
a work function metal (WFM) layer on the high-k dielectric layer;
a spacer adjacent to the gate structure; and
an air gap between the gate dielectric layer and the spacer, directly under the high-k dielectric layer, and exposing a surface of the substrate and the gate dielectric layer, wherein a sidewall of the air gap is aligned with a sidewall of the high-k dielectric layer.

2. The semiconductor device of claim 1, further comprising:
a first air gap between the gate dielectric layer and the spacer adjacent to one side of the gate structure; and
a second air gap between the gate dielectric layer and the spacer adjacent to another side of the gate structure.

3. The semiconductor device of claim 1, wherein the gate dielectric layer comprises silicon oxide.

4. The semiconductor device of claim 1, wherein the gate electrode comprises metal.

5. The semiconductor device of claim 1, further comprising a source/drain region adjacent to two sides of the spacer.

* * * * *